(12) United States Patent
Chen (10) Patent No.: US 7,660,708 B2
(45) Date of Patent: Feb. 9, 2010

(54) S-MATRIX TECHNIQUE FOR CIRCUIT SIMULATION

(75) Inventor: Houfei Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 623 days.

(21) Appl. No.: 11/200,449

(22) Filed: Aug. 9, 2005

(65) Prior Publication Data
US 2007/0038428 A1    Feb. 15, 2007

(51) Int. Cl.
G06F 7/60      (2006.01)
G06F 17/50     (2006.01)

(52) U.S. Cl. ............................................ 703/2; 703/14
(58) Field of Classification Search .............. 703/2, 703/14
See application file for complete search history.

(56) References Cited

U.S. PATENT DOCUMENTS

| | | | | |
|---|---|---|---|---|
| 5,946,482 A | * | 8/1999 | Barford et al. | 703/14 |
| 6,810,506 B1 | | 10/2004 | Levy | 716/2 |
| 7,088,110 B1 | * | 8/2006 | Bois et al. | 324/638 |
| 2005/0240883 A1 | * | 10/2005 | Huang et al. | 716/1 |

OTHER PUBLICATIONS

S. Lee, "Using Single-Ended S-Matrices to Characterize Differential Components in Mobile Radio Design," RF Design & Microwave Tech. for Design Engineers (Apr. 1, 2003).

C. Huang, "Using S Parameters for Signal Integrity Analysis,"EE Times (Feb. 23, 2004).

X. Leijtens, "S-Matrix Oriented CAD-tool for Photonic Integrated Circuits," SPIE vol. 3278, pp. 6-12 (1998).

J. Sifri et al., "Simulation Tools Converge on Large RFICs," CommsDesign (Jun. 1, 2002).

DeCarlo, Raymond and Pen Min Lin. Excerpt from "Linear Circuit Analysis, A Time Domain and Phasor Approach: Chapter 4—Node and Loop Analysis." vol. 1. Englewood Cliff: Prentice-Hall, Inc. 1995. pp. 102-106.

Kielkowski, Ron M. Excerpt from "Inside SPICE: Chapter 2—Understanding Circuit Simulation." Second Edition. New York: McGraw-Hill, Inc. 1998. pp. 16-19.

Litovski, Vanco. and Mark Zwolinski. Excerpt from "VLSI Circuit Simulation and Optimization: Chapter 1—Linear Resistive Circuit Analysis." Chapman & Hall. 1997. http://www.ecs.soton.ac.uk/%7Emz/CctSim/index.htm.

* cited by examiner

*Primary Examiner*—Paul L Rodriguez
*Assistant Examiner*—Nithya Janakiraman
(74) *Attorney, Agent, or Firm*—Wong, Cabello, Lutsch, Rutherford & Brucculeri, LLP (57) ABSTRACT

A methodology for combining two or more S-parameter blocks/matrices (each representing a circuit or network, or the interconnection between a circuit or network) into a single S-matrix are described. Such a matrix may be beneficially used to simulate the circuit or network represented by the multiply interconnected circuits or networks.

19 Claims, 3 Drawing Sheets

S-MATRIX TECHNIQUE FOR CIRCUIT SIMULATION

BACKGROUND

The invention relates generally to integrated circuit simulation and, more particularly but not by way of limitation, to techniques for simulating the interconnections between multiple integrated circuit components using only an S-parameter based approach.

Modern computer systems may be thought of as a combination of a number of interconnected subsystems. For example, a personal computer ("PC") typically includes a power subsystem (to generate and distribute electrical power), a memory subsystem (to access, use and control system memory), a processor subsystem (to access, use and control one or more system processors), etc. Each subsystem, in turn, may itself be composed of multiple interconnected devices.

Figure 1:
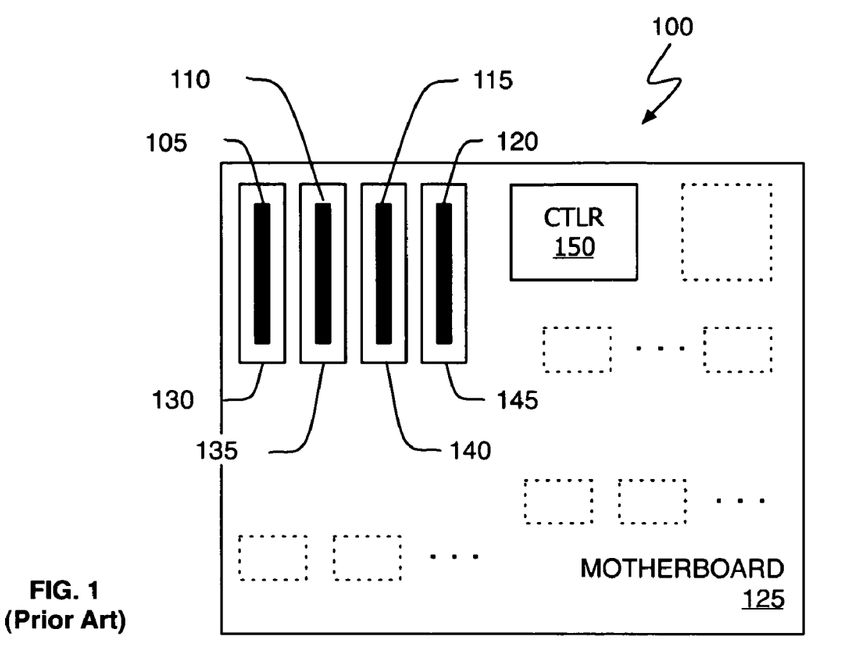
FIG. 1 shows, in block diagram form, an illustrative memory subsystem for a personal computer.
Figure 2:
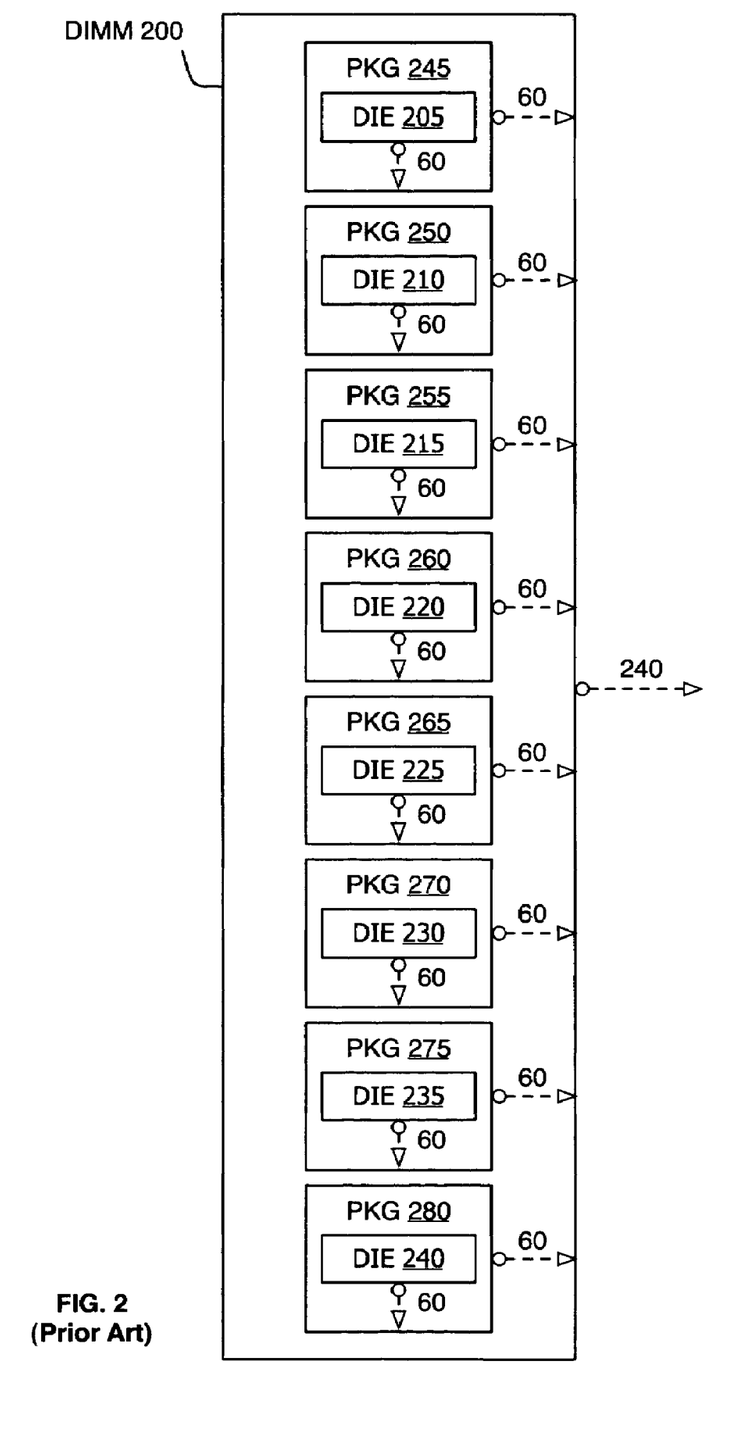
FIG. 2 shows, in block diagram form, components of an illustrative dual in-line memory module.

Referring to FIG. 1, illustrative PC memory subsystem 100 includes four (4) dual in-line memory modules ("DIMMs") 105-120 coupled to motherboard 125 through connectors 130-145 and further coupled to memory controller 150 through electrically conductive paths (not shown). Referring to FIG. 2, illustrative DIMM 200 (e.g., one of 105-120) includes memory dies 205-240, each coupled to one of packages 245-280 each of which is further coupled to DIMM 200 (see, for example, part number MT8HTF3264A from Micron Technologies, Inc.). DIMM 200 could then, for example, couple to a motherboard (e.g., motherboard 125) via connector 285 (e.g., one of 130-145).

If DIMM 200 is used in memory subsystem 100, there are 7,200 interconnections or ports that must be identified and modeled during the design and simulation of subsystem 100: each memory die (e.g., 205-240) has 60 interconnects or ports to its package—(60×8×4); each package (e.g., 245-280) has 60 interconnects or ports to its module—(60×8×4); each module (e.g., 200 or 105-120) has 240 interconnects to its motherboard connector—(240×4); each connector (e.g., 130-145) has 240 interconnects to motherboard 125—(240×4); and memory controller 150 has 1,440 interconnects (memory controller die to memory controller package and memory controller package to motherboard).

As the complexity of individual circuits and the systems within which these circuits are used increase, fast and accurate simulations become more important in both the pre-layout and post-layout phase of system design. Accurate circuit simulations can provide feedback to design engineers to aid in their designs' refinement so that circuit and system objectives may be met. Prior art circuit simulation packages such as SPICE (Simulation Program Integrated Circuits, developed at the University of California, Berkeley) simulate circuit behavior using a modified nodal analysis ("MNA") approach. In MNA, an equation for the voltage at each node in a network in terms of the current through the node is developed in accordance with Kirchoff's current law. The collection of all such equations for a network is represented in matrix form. Solution of the matrix is tantamount to simulating the circuit.

As circuit operational frequencies have increased, discontinuities such as interconnects (e.g., see FIG. 2) are described most easily in terms of S parameters. It will be recognized by those of ordinary skill in the art of circuit simulation that S parameters refer to the scattering matrix—a matrix that describes the response of an N-port network to voltage signals at each port. Prior art incorporation of S parameter blocks into a circuit simulation application is achieved by transforming the scattering matrices for each block into admittance or impedance matrices. Unfortunately, this transformation can be slow and result in admittance and/or impedance matrices that are ill-conditioned. Ill-conditioned matrices within a MNA-based application can, in turn, introduce significant numerical errors into the simulation's result—dramatically reducing the quality and reliability of the simulation's result. Thus, it would be beneficial to provide a technique to combine multiple S-parameter block matrices (each representing the behavior of a circuit or the interconnection between different circuits or networks) so that the combined circuit may be simulated directly using S parameters/matrices.

SUMMARY

Methods in accordance with the invention combine two or more S-parameter descriptions of electronic circuits or networks into a single S-parameter description, the combined S-parameter description incorporating or accounting for connections between the individual electronic circuits or networks. The combined S-parameter description permits the simulation of large, complex circuits or networks wholly using S-parameters, thereby eliminating the need to convert S-parameter descriptions into impedance and/or admittance descriptions and, as a consequence, the introduction of numerical errors as a result thereof.

DETAILED DESCRIPTION

In the following detailed description, a methodology for combining two or more S matrices (each representing a circuit or network, or the interconnection between a circuit or network) into a single S-matrix is described. Such a matrix may be beneficially used to simulate the combined network—that is, the network comprising the combined individual networks or circuits. As used herein, the term "simulate" means to simulate the electrical behavior of an electronic circuit. The invention, described in terms of modeling and simulating the interconnections between memory subsystem components, is presented to enable any person skilled in the art to make and use the invention as claimed, variations of which will be readily apparent to those skilled in the art. Accordingly, the claims appended hereto are not intended to be limited by the disclosed embodiment, but are to be accorded their widest scope consistent with the principles and features disclosed herein.

It will be recognized that an electronic circuit may be viewed as a multi-port network, and that multi-port networks may themselves be viewed as interconnected sub-networks. The dual, that individual sub-networks may be combined to form a single network (representing a complex circuit), will also be understood by those of ordinary skill. This insight, and the detailed teaching below, makes it possible to represent interconnected S-matrix representations of multiple sub-networks as a single S-matrix. This, in turn, permits the simulation of large, complex circuits wholly using S-parameters— eliminating the need to convert S-parameter descriptions into impedance and/or admittance descriptions and, as a consequence, the introduction of numerical errors as a result thereof.

Figure 3:
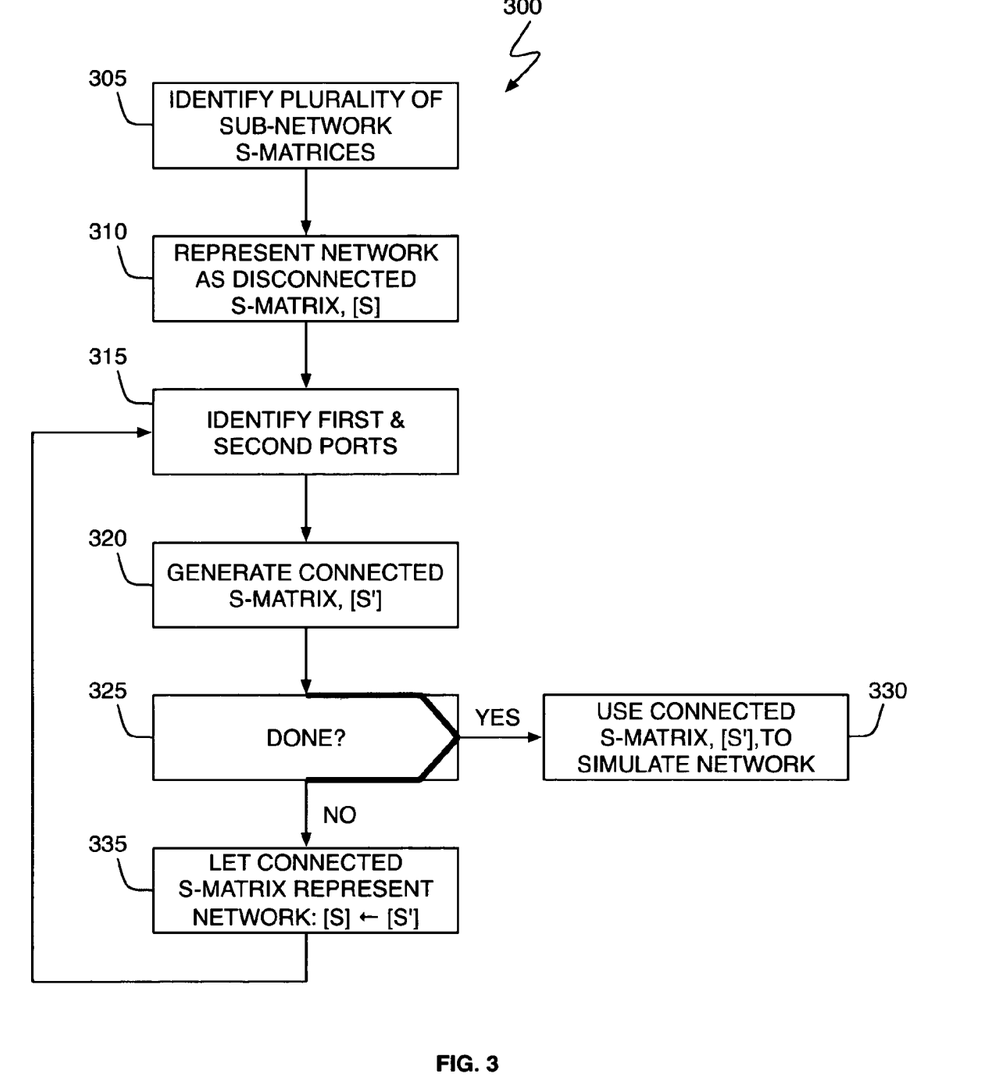
FIG. 3 shows, in flowchart form, S-matrix representation method for electronic circuit simulation in accordance with one embodiment of the invention.

Referring to FIG. 3, S-matrix representation method 300 in accordance with one embodiment of the invention is illustrated in flowchart form. To begin, two or more S-matrices are identified (block 305), each representing an element, component or sub-network of the desired final circuit. Referring to FIGS. 1 and 2, for example, S-matrix representations for each die (e.g., die 205), package (e.g., package 245), memory module (e.g., DIMM 200) and motherboard connector (e.g., connector 130) comprising memory subsystem 100 are identified or obtained. Next, the individual sub-network S-matrices are combined to form a single S-matrix, [S] (block 310). In one embodiment, S-matrix [S] is formed by placing each sub-network's S-matrix along the diagonal of matrix [S], and zeros in all other positions. For example, if there exists "n" sub-network S-matrices [S1] through [Sn], S-matrix [S] of block 310 is given by:

$$[S] = \begin{bmatrix} [S1] & \cdots & 0 \\ \vdots & \ddots & \vdots \\ 0 & \cdots & [Sn] \end{bmatrix} \qquad \text{EQ. 1}$$

To begin the interconnection process, a port from each of two sub-networks is identified (block 315). Through techniques described below, the interconnection of these ports result in S-matrix [S'] having two less rows and two less columns than the S-matrix before such interconnections are incorporated (block 320). If all interconnections between the plurality of sub-network S-matrices have been incorporated into S-matrix [S'] (the "Yes" prong of block 325), formation of S-matrix [S'] is complete and may be used to simulate the desired circuit (block 330). If all interconnections between the plurality of sub-network S-matrices have not been incorporated into S-matrix [S'] (the "No" prong of block 325), S-matrix [S'] is used as the new "starting point" and processing continues at block 315. That is, S-matrix [S'] is treated as S-matrix [S] for purposes of incorporating or accounting for a next interconnection. As shown if FIG. 3, acts in accordance with blocks 315 and 320 are repeated until all connections between the various sub-networks have been incorporated into S-matrix [S'].

It is significant to note that S-matrix [S'] of block 330 is described only in terms of S-parameters. Further, as will be shown below, generation of S-matrix [S'] in accordance with the invention does not require the use of admittance and/or impedance descriptions of any sub-network. Accordingly, circuit simulations using S-matrix [S'] can lead to faster and more accurate circuit simulations than prior art techniques.

As described, FIG. 3 outlines a means, technique or methodology directed to accounting for one-to-one connections between different sub-networks. That is, connecting port A in sub-network A' to port B in sub-network B'. It will be recognized that this approach is equally capable of accounting for more complex interconnection topologies. For example, if port A in sub-network A' is to be connected to port B in sub-network B' and also to port C in sub-network C', S-matrix representation 300 can account for this by first connecting Port A to port B, and then connecting port C.

For purposes of illustration, let the acts of block 305 identify two sub-networks S1 and S2 that are each described in terms of their S-matrix, [S1] and [S2]. S-matrix [S1] could, for example, represent a single memory die such as die 205 while S-matrix [S2] could represent the package to which the die is to be connected, i.e., package 245. Alternatively, S-matrix [S1] could represent DIMM 200 with all of its internal components already interconnected (i.e., each of dies 205-240 connected to their respective one of packages 245-280, each of which are, in turn, connected to DIMM 200) while S-matrix [S2] could represent a motherboard DIMM connector (e.g., connector 105).

In accordance with block 310, S-matrices [S1] and [S2] are combined as shown in EQ. 2 to form matrix [S]:

$$[S]_{N \times N} = \begin{bmatrix} [S1] & 0 \\ 0 & [S2] \end{bmatrix}. \qquad \text{EQ. 2}$$

In accordance with block 315, assuming that port i in sub-network S1 is to be connected to port j in sub-network S2. The scattering parameter equation for this network is then given by:

$$\begin{bmatrix} b_1 \\ \vdots \\ b_i \\ \vdots \\ b_j \\ \vdots \\ b_N \end{bmatrix} = [S]_{N \times N} \begin{bmatrix} a_1 \\ \vdots \\ a_i \\ \vdots \\ a_j \\ \vdots \\ a_N \end{bmatrix}_{N \times 1}, \qquad \text{EQ. 3}$$

where, [a] represents the signals incident or input to network S, [b] represents the signals reflected or output from network S and the ith and jth elements $a_i$, $a_j$, $b_i$ and $b_j$ represent the ith and jth ports of the two sub-networks S1 and S2. If, as we assume here, port i and j are to be connected the connection equation is given by:

$$\begin{bmatrix} b_i \\ b_j \end{bmatrix} = \begin{bmatrix} 0 & 1 \\ 1 & 0 \end{bmatrix} \begin{bmatrix} a_i \\ a_j \end{bmatrix}. \qquad \text{EQ. 4}$$

Next, interconnection operations in accordance with block 320 begin by performing row transformations on the disconnected network represented by EQ. 3 such that element $b_i$ is swapped with element $b_1$ and element $b_j$ is swapped with element $b_2$:

$$\begin{bmatrix} b_i \\ b_j \\ \vdots \\ b_1 \\ \vdots \\ b_2 \\ \vdots \\ b_N \end{bmatrix} = \begin{bmatrix} S_{i1} & S_{i2} & \cdots & S_{iN} \\ S_{j1} & S_{j1} & \cdots & S_{jN} \\ \vdots & \vdots & & \vdots \\ S_{11} & S_{12} & \cdots & S_{1N} \\ \vdots & \vdots & & \vdots \\ S_{21} & S_{22} & \cdots & S_{2N} \\ \vdots & \vdots & & \vdots \\ S_{N1} & S_{N2} & \cdots & S_{NN} \end{bmatrix}_{N \times N} \begin{bmatrix} a_i \\ a_2 \\ \vdots \\ a_i \\ \vdots \\ a_j \\ \vdots \\ a_N \end{bmatrix}_{N \times 1}. \qquad \text{EQ. 5}$$

For convenience and to reduce notational clutter, let the S-matrix of EQ. 5 be represented as [S3], that is:

$$[S3] = \begin{bmatrix} S_{i1} & S_{i2} & \ldots & S_{iN} \\ S_{j1} & S_{j1} & \ldots & S_{jN} \\ \vdots & & & \vdots \\ S_{11} & S_{12} & \ldots & S_{1N} \\ \vdots & & & \vdots \\ S_{21} & S_{22} & \ldots & S_{2N} \\ \vdots & & & \vdots \\ S_{N1} & S_{N2} & \ldots & S_{NN} \end{bmatrix}_{N \times N} \quad \text{EQ. 6}$$

Column operations on the system of EQ. 5 (using EQ. 6 notation) are now performed such that element $a_i$ is swapped with element $a_1$ and element $a_j$ is swapped with element $a_2$:

$$\begin{bmatrix} b_i \\ b_j \\ \vdots \\ b_1 \\ \vdots \\ b_2 \\ \vdots \\ b_N \end{bmatrix} = \begin{bmatrix} S3_{1i} & S3_{1j} & \ldots & S3_{11} & \ldots & S3_{12} & \ldots & S3_{1N} \\ S3_{2i} & S3_{2j} & \ldots & S3_{21} & \ldots & S3_{22} & \ldots & S3_{2N} \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ S3_{Ni} & S3_{Nj} & \ldots & S3_{N1} & \ldots & S3_{N2} & \ldots & S3_{NN} \end{bmatrix}_{N \times N} \begin{bmatrix} a_i \\ a_j \\ \vdots \\ a_1 \\ \vdots \\ a_2 \\ \vdots \\ a_N \end{bmatrix}_{N \times 1} \quad \text{EQ. 7}$$

Again, for convenience and to reduce notational clutter, let the S-matrix of EQ. 7 be represented as [S4], that is:

$$[S4] = \begin{bmatrix} S3_{1i} & S3_{1j} & \ldots & S3_{11} & \ldots & S3_{12} & \ldots & S3_{1N} \\ S3_{2i} & S3_{2j} & \ldots & S3_{21} & \ldots & S3_{22} & \ldots & S3_{2N} \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ \vdots & \vdots & & \vdots & & \vdots & & \vdots \\ S3_{Ni} & S3_{Nj} & \ldots & S3_{N1} & \ldots & S3_{N2} & \ldots & S3_{NN} \end{bmatrix}_{N \times N} \quad \text{EQ. 8}$$

Figure 4:
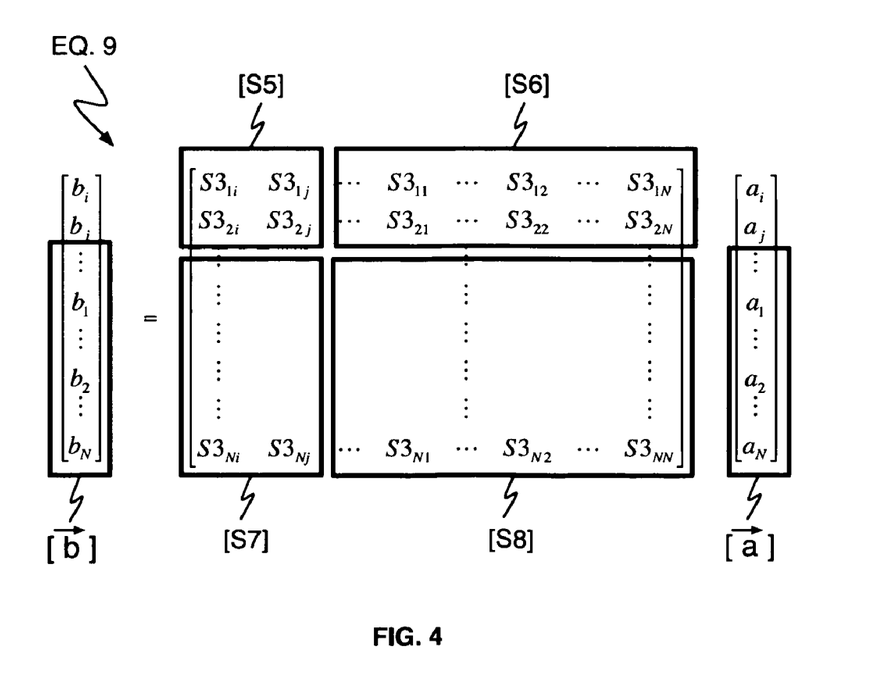
FIG. 4 defines the notation introduced in EQ. 9.

Rewriting EQ. 7 in matrix partition format (using EQ. 8 notation) yields $$\begin{bmatrix} b_i \\ b_j \\ \vec{b} \end{bmatrix} = \begin{bmatrix} [S5]_{2 \times 2} & [S6]_{2 \times (N-2)} \\ [S7]_{(N-2) \times 2} & [S8]_{(N-2) \times (N \times 2)} \end{bmatrix}_{N \times N} \begin{bmatrix} a_i \\ a_j \\ \vec{a} \end{bmatrix}_{N \times 1}, \quad \text{EQ. 9}$$

where $[\vec{b}]$, $[\vec{a}]$, [S5], [S6], [S7] and [S8] are as defined in FIG. 4.

Rewriting EQ. 9 to separate $b_i$ and $b_j$ yields:

$$\begin{bmatrix} b_i \\ b_j \end{bmatrix} = [S5]_{2 \times 2} \begin{bmatrix} a_i \\ a_j \end{bmatrix}_{2 \times 1} + [S6]_{2 \times (N-2)} [\vec{a}]_{(N-2) \times 1} \quad \text{EQ. 10}$$

$$[\vec{b}] = [S7]_{(N-2) \times 2} \begin{bmatrix} a_i \\ a_j \end{bmatrix}_{2 \times 1} + [S8]_{(N-2) \times (N \times 2)} [\vec{a}]_{(N-1) \times 1'} \quad \text{EQ. 11}$$

and

Substituting EQ. 4 into EQ. 10 yields:

$$\begin{bmatrix} 0 & 1 \\ 1 & 0 \end{bmatrix} \begin{bmatrix} a_i \\ a_j \end{bmatrix} = [S5]_{2 \times 2} \begin{bmatrix} a_i \\ a_j \end{bmatrix}_{2 \times 1} + [S6]_{2 \times (N-2)} [\vec{a}]_{(N-2) \times 1}, \quad \text{EQ. 12}$$

which is equivalent to (in EQ. 13, the first item on right side of equation should not be there.)

$$\left[ \begin{bmatrix} 0 & 1 \\ 1 & 0 \end{bmatrix} - [S5] \right] \begin{bmatrix} a_i \\ a_j \end{bmatrix} = [S6]_{2 \times (N-2)} [\vec{a}]_{(N-2) \times 1}. \quad \text{EQ. 13}$$

Letting $$[S9] = \left[ \begin{bmatrix} 0 & 1 \\ 1 & 0 \end{bmatrix} - [S5] \right]_{2 \times 2} \quad \text{EQ. 14}$$

yields:

$$\begin{bmatrix} a_i \\ a_j \end{bmatrix} = [S9]_{2 \times 2}^{-1} [S6]_{2 \times (N-2)} [\vec{a}]_{(N-2) \times 1}. \quad \text{EQ. 15}$$

Substituting EQ. 15 into EQ. 11 yields:

$$[\vec{b}] = [S7]_{(N-2) \times 2} [S9]_{2 \times 2}^{-1} [S6]_{2 \times (N-2)} [\vec{a}]_{(N-2) \times 1} + [S8]_{(N-2) \times (N-2)} [\vec{a}]_{(N-2) \times 1'} \quad \text{EQ. 16}$$

which can be written as:

$$[\vec{b}] = [S']_{(N-2) \times (N-2)} [\vec{a}]_{(N-2) \times 1'} \quad \text{EQ. 17}$$

where $[S'] = [S7][S9]^{-1}[S6] + [S8]$.

S-Matrix [S'] represents the connected S-matrix having two fewer rows and two fewer columns than original S-Matrix [S] (see EQ. 3). That is, S-Matrix [S'] represents sub-network S1 connected to sub-network S2 via ports i and j. As noted above with respect to FIG. 3, this process may be repeated for each port of a first sub-network that is to be connected to another port of a second sub-network. When all such connections have been accounted for (i.e., the "Yes" prong of block 325 in FIG. 3), S-Matrix [S'] may be used directly to simulate the behavior of the interconnected sub-networks—i.e., the circuit or system represented by S-matrix [S'].

As described herein, an electronic circuit or system may be simulated using an S-matrix generated directly from sub-network S-matrices. No translation from S parameter based descriptions to impedance and/or admittance based descriptions are needed (such translations are required in prior art MNA simulators). As a result, simulations using an S-matrix description in accordance with the invention avoid the time to make these translations and the numerical errors that such translations can introduce.

Various changes in the materials, components, circuit elements, as well as in the details of the illustrated operational methods are possible without departing from the scope of the following claims. For instance, the inventive technology is applicable to characterizing and simulating systems other than the memory subsystem described above (e.g., as shown in FIG. 1). In addition, acts in accordance with FIG. 3 may be performed by a programmable control device executing instructions organized into one or more program modules. A programmable control device may be a single computer processor, a special purpose processor (e.g., a digital signal processor, "DSP"), a plurality of processors coupled by a communications link or a custom designed state machine. Custom designed state machines may be embodied in a hardware device such as an integrated circuit including, but not limited to, application specific integrated circuits ("ASICs") or field programmable gate array ("FPGAs"). Storage devices suitable for tangibly embodying program instructions include, but are not limited to: magnetic disks (fixed, floppy, and removable) and tape; optical media such as CD-ROMs and digital video disks ("DVDs"); and semiconductor memory devices such as Electrically Programmable Read-Only Memory ("EPROM"), Electrically Erasable Programmable Read-Only Memory ("EEPROM"), Programmable Gate Arrays and flash devices.

The invention claimed is:

1. A method to simulate the electrical behavior of two interconnected electronic networks, comprising:
    obtaining a first S-matrix representation of a first electronic network, the first electronic network having a first port;
    obtaining a second S-matrix representation of a second electronic network, the second electronic network having a second port;
    calculating a third S-matrix directly from the first and second S-matrix representations, the third S-matrix representing the first electronic network connected to the second electronic network through the first and second ports; and
    simulating the interconnected electronic networks using the third S-matrix.

2. The method of claim 1, wherein the act of calculating is performed for each pair of ports that connect the first and second electronic networks.

3. The method of claim 1, wherein the first S-matrix represents two or more interconnected electronic networks.

4. The method of claim 1, wherein each of the first and second S-matrices represent two or more interconnected electronic networks.

5. A method to simulate the electrical behavior of interconnected electronic networks, comprising:
    identifying a first port in a first electronic network, wherein the first electronic network is represented by a first S-matrix having a-rows and c-columns;
    identifying a second port in a second electronic network, wherein the second electronic network is represented by a second S-matrix having b-rows and d-columns;
    calculating a third S-matrix directly from the first and second S-matrix representations, the third S-matrix representing an electronic network wherein the first port in the first electronic network is coupled to the second port in the second electronic network, the third S-matrix having (a+b−2)-rows and (c+d−2)-columns; and
    simulating the interconnected electronic networks using the third S-matrix.

6. The method of claim 5, wherein each of the first and second S-matrices represent two or more interconnected electronic circuits.

7. The method of claim 5, further comprising simulating the interconnected electronic network directly using the third S-matrix.

8. A method to simulate the electrical behavior of interconnected electronic networks, comprising:
    identifying a first port in a first electronic network, wherein the first electronic network is represented by a first S-matrix;
    identifying a second port in a second electronic network, wherein the second electronic network is represented by a second S-matrix;
    calculating a third S-matrix directly from the first and second S-matrices, the third S-matrix representing the disconnected first and second electronic networks, the third S-matrix having a-rows and b-columns;
    calculating a fourth S-matrix directly from the third S-matrix, the fourth S-matrix representing an electronic network wherein the first electronic network is connected to the second electronic network, the fourth S-matrix having (a−2) rows and (b−2) columns; and
    simulating the electronic network represented by the fourth S-matrix directly using the fourth S-matrix.

9. The method of claim 8, wherein each of the first and second S-matrices represent two or more interconnected electronic circuits.

10. The method of claim 8, wherein the act of calculating the third S-matrix comprises:
    assigning the first S-matrix to a first row, first column element in the third S-matrix;
    assigning the second S-matrix to a second row, second column element in the third S-matrix; and
    assigning zeros (0) in all other elements in the third S-matrix.

11. A method to simulate the electrical behavior of interconnected electronic circuits, comprising:
    obtaining an S-parameter description of a first electronic circuit;
    obtaining an S-parameter description of a second electronic circuit;
    computing an S-parameter description of the first electronic circuit connected to the second electronic circuit directly from the obtained S-parameter descriptions of the first and second electronic circuits; and
    simulating the electronic circuit represented by the computed S-parameter description using the computed S-parameter description.

12. The method of claim 11, further comprising generating a disconnected S-parameter description of the first and second electronic circuits, the disconnected S-parameter description representing the first electronic circuit and the second electronic circuit with no connections between them, the disconnected S-parameter description having a-rows and b-columns.

13. The method of claim 12, wherein the act computing the S-parameter description of the first electronic circuit connected to the second electronic circuit results in an S-parameter description having two rows and two columns less than the disconnected S-parameter description for each connection between the first and second electronic circuits.

14. A method of simulating the electrical performance of interconnected electrical circuits, comprising:

obtaining a first S-matrix representation of a first electronic circuit, the first electronic circuit having a first port;

obtaining a second S-matrix representation of a second electronic circuit, the second electronic circuit having a second port;

means for computing a third S-matrix directly from the first and second S-matrix representations, the third S-matrix representing the first electronic circuit coupled to the second electronic circuit via the first and second ports; and simulating the electrical performance of the interconnected first and second electronic circuits using the third S-matrix.

15. The method of claim 14, further comprising means for computing a fourth S-matrix representing the first electronic circuit disconnected from the second electronic circuit.

16. The method of claim 15, wherein the means for computing the third S-matrix results in an S-matrix that has 2 fewer rows and 2 fewer columns than the fourth S-matrix for each connection between the first and second electronic circuits.

17. The method of claim 14, wherein the first S-matrix represents two or more electronic networks.

18. The method of claim 14, wherein each of the first and second S-matrices represent two or more multi-port networks.

19. A program storage device, readable by a programmable control device, comprising instructions stored on the program storage device for causing the programmable control device to perform one of the methods of claim 1, 5, 8, 11 or 14.

* * * * *

UNITED STATES PATENT AND TRADEMARK OFFICE
CERTIFICATE OF CORRECTION

PATENT NO. : 7,660,708 B2  Page 1 of 1
APPLICATION NO. : 11/200449
DATED : February 9, 2010
INVENTOR(S) : Houfei Chen It is certified that error appears in the above-identified patent and that said Letters Patent is hereby corrected as shown below:

On the face page, in field (57), under "Abstract", in column 2, line 6, delete "multiply" and insert -- multiple --, therefor.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,660,708 B2 | Page 1 of 1 |
| APPLICATION NO. | : 11/200449 | |
| DATED | : February 9, 2010 | |
| INVENTOR(S) | : Houfei Chen | |

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 955 days.

Signed and Sealed this

Twenty-second Day of June, 2010

David J. Kappos
*Director of the United States Patent and Trademark Office*